United States Patent [19]

Weinstein

[11] 3,925,879

[45] Dec. 16, 1975

[54] PROCESS OF FABRICATING PHOTOSENSITIVE DARLINGTON DEVICE

[75] Inventor: Harold Weinstein, Sherman Oaks, Calif.

[73] Assignee: Sensor Technology, Inc., Chatsworth, Calif.

[22] Filed: Sept. 11, 1974

[21] Appl. No.: 505,036

[52] U.S. Cl. ...................... 29/572; 29/574; 29/591; 357/30; 357/46

[51] Int. Cl.² ........................................... H01C 7/08

[58] Field of Search ............ 29/572, 574, 578, 584, 29/591; 357/30, 46

[56] References Cited

UNITED STATES PATENTS

| | | | |
|---|---|---|---|
| 3,013,232 | 12/1961 | Lubin | 29/572 |
| 3,761,326 | 9/1973 | Weckler | 29/572 |

*Primary Examiner*—Carl E. Hall
*Attorney, Agent, or Firm*—Flam & Flam

[57] ABSTRACT

Photo-Darlington devices having a response within a narrow range of current output for a certain illumination level are produced by initially providing each device with a light-admitting opening of smaller than requisite size. The device outputs are measured separately, and based on such measurements, the individual openings are enlarged sufficiently so that the output current from each device falls within the requisite range.

For improved performance, each photo-Darlington device has a pair of emitters spaced on opposite sides of the light admitting opening. This provides better efficiency and results in more consistent output despite non-uniform illumination of the device.

6 Claims, 7 Drawing Figures

PROCESS OF FABRICATING PHOTOSENSITIVE DARLINGTON DEVICE

BACKGROUND OF THE INVENTION

1. Field of the Invention

The present invention relates to improved phototransistor Darlington devices, and to a high yield process for making such devices.

2. Description of the Prior Art

Incorporation of a phototransistor in a Darlington circuit results in a photosensitive device having relatively high output current for a certain level of incident light. This performance results since the effective gain or $\beta$ of the device is the product of the $\beta$'s of the individual phototransistor and second transistor in the Darlington circuit. Thus, e.g., even if both transistors have the relatively low gain of $\beta$=30, the overall device gain will be high, namely $\beta$=900. Thus the Darlington device will have much higher output than that realizable with a single phototransistor, particularly since it is difficult to make an individual transistor with a $\beta$greater than about 600.

However, the fact that the gains are multiplicative in a photo-Darlington device means that process control is more difficult. Generally such devices are batch fabricated, with a large plurality of devices being formed on a single semiconductor wafer. The phototransistor and second transistors of all the devices are formed at the same time. As a result of normal process variations certain of the transistors may have gains above or below the to tolerable limits. Because the $\beta$ 's of the two transistors on each device are multiplied, even a small variation in the gain of one transistor can result in a device that must be discarded as out of acceptable performance range. Low yield results.

Generally the desired device performance is specified in terms of output current for a certain incident light level. For example, it may be necessary to produce a plurality of devices each of which provides an output current of between 1.5 milliamperes minimum and 6 ma maximum when illuminated with 2 milliwatts per square centimeter of light from a tungsten source having a color temperature of 2870°. Using prior art fabrication techniques, it was quite common to produce in the same wafer some devices within the desired 1.5 to 6 ma range, and other unacceptable devices which had output currents as high as 16 ma.

An object of the present invention is to provide a process for fabricating photo-Darlington devices that results in higher yields than possible using prior art techniques.

Another shortcoming of prior art photosensors is that the current output may differ if the illumination striking the device is not uniform. Thus a further object of the present invention is to provide a photo-Darlington device in which the current output is substantially the same regardless of light uniformity.

SUMMARY OF THE INVENTION

These and other objectives are achieved by providing a process for fabricating photo-Darlington devices in which the area of the light admitting opening is controlled in response to measured device performance. Initially, a light passage of minimum size is provided on each device in a single wafer array. Then the current output of each device is measured individually while illuminated with a known intensity of light. For those devices having a current output below the desired range, the light admitting opening is enlarged sufficiently to bring the output to an acceptable value.

In a preferred embodiment, each device is covered with aluminum having a central opening smaller than required. After separate measurement of device performance, the opening of each individual device is enlarged by etching to achieve the desired current output. Laser etching also could be used for enlargement of the opening. Alternatively, an initially large passageway could be reduced in size to obtain the correct output.

To improve the response consistency of the photo-Darlington device, two spaced emitters are provided in the phototransistor. This configuration appears to improve the current distribution and perhaps also give greater efficiency. The result is consistent output even if the illumination level is not uniform over the entire exposed surface of the device.

BRIEF DESCRIPTION OF THE DRAWINGS

A detailed description of the invention will be made with reference to the accompanying drawings wherein like numerals designate corresponding elements in the several figures. These drawings, unless described as diagrammatic or unless otherwise indicated, are to scale.

DESCRIPTION OF THE PREFERRED EMBODIMENTS

The following detailed description is of the best presently contemplated modes of carrying out the invention. This description is not to be taken in a limiting sense, but is made merely for the purpose of illustrating the general principles of the invention since the scope of the invention is best defined by the appended claims.

Operational characteristics attributed to the form of the invention first described also shall be attributed to forms later described, unless such characteristics obviously are inapplicable or unless specific exception is made.

Figure 1:
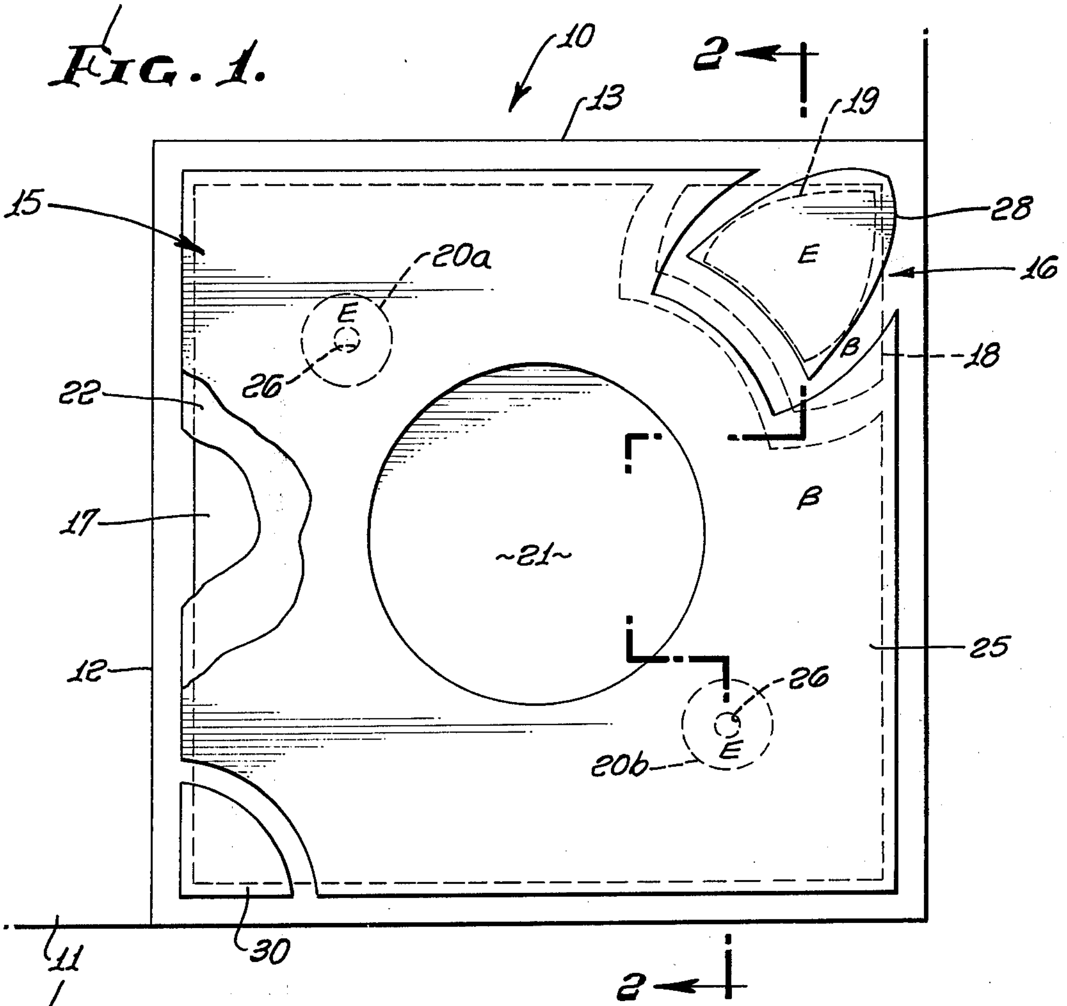
FIG. 1 is a top view of a photo-Darlington device in accordance with the present invention.
Figure 2:
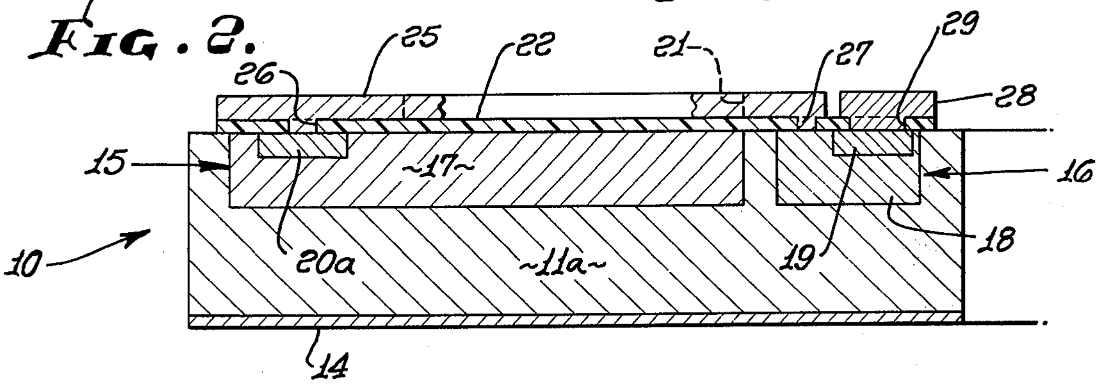
FIG. 2 is a sectional view of the device of FIG. 1 as viewed along the line 2—2 thereof.
Figure 3:
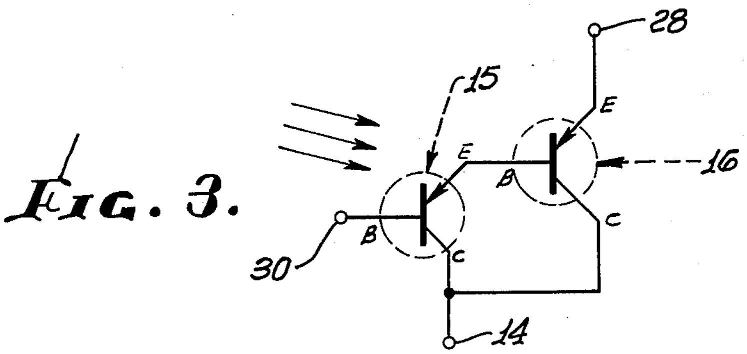
FIG. 3 is an electrical schematic diagram of the device of FIG. 1.

Referring to FIGS. 1 and 2, the inventive photosensitive Darlington device 10 advantageously is batch fabricated with a plurality of other like devices on a common semiconductor wafer 11. When completed, the individual devices 10 are severed from the wafer 11, as by scribing along the lines 12, 13.

The semiconductor substrate **11*a* advantageously is doped to a N+ conductivity, and forms the common collector of the device 10. A layer 14 of conductive material on the bottom of the substrate 11*a* provides an electrical connection to the common collectors. A phototransistor 15 and a second transistor 16** are formed by double diffusion into the substrate 11*a*.

Figure 4:
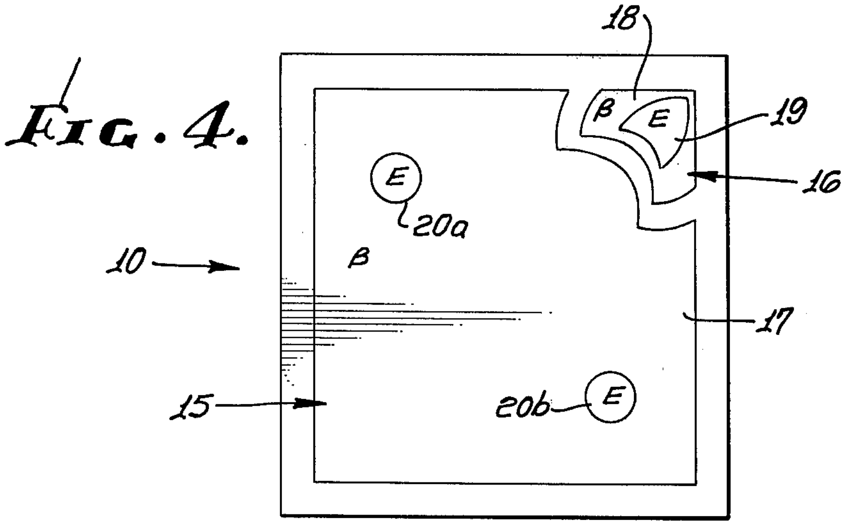
FIG. 4 illustrates the base and emitter geometry of the device of FIG. 1, as viewed from the top.

The base regions 17, 18 of the two transistors 15, 16 are formed simultaneously by diffusion of a P-type dopant into the substrate 11a. The preferred base configuration is shown in FIG. 4. The base region 17 of the phototransistor 15 occupies substantially the entire area of the device 10 except for a small corner region in which the base 18 of the second transistor 16 is situated. The diffusion is carried out in a known manner through a mask which defines the preferred base geometry illustrated in FIG. 4.

The emitters are formed by subsequent diffusion of an N-type dopant into the base regions 17, 18. The second transistor 16 has a single crest-shaped emitter 19. In accordance with the present invention, the phototransistor 15 is provided with a pair of emitters 20*a*, 20*b* that are situated on opposite sides of a light-admitting opening 21. The emitters 20*a*, 20*b* advantageously are circular, and are connected together electrically as described below. This dual emitter configuration is believed to provide more consistent output current despite non-uniform illumination through the opening 21.

During the fabrication process, an electrically insulating but optically transparent oxide layer 22 is formed over the entire substrate 11a. Typically for a silicon substrate, this layer 22 comprises silicon oxide. Metalization atop the layer 22 provides electrical connection to the various base and emitter regions, and defines the light-admitting opening 21.

A major portion of the device 11*a* is covered by a metalization layer 25 having generally the same outline as the base region 17. To provide electrical contact to the emitters 20*a*, 20*b*, the metalization 25 extends through a pair of openings 26 in the layer 22 (FIG. 2) down to the respective emitters 20*a*, 20*b*. Furthermore, the metalization 25 extends over a portion of the base 18 of the second transistor 16 and makes electrical contact with this base 18 via an opening 27 (FIG. 2) through the oxide layer 22. In this manner direct electrical interconnection between both of the phototransistor emitters 20*a*, 20*b* and the second transistor base 18 is facilitated by the metalization layer 25.

Electrical connection to the emitter 19 of the second transistor 16 is accomplished by a separate metalization layer 28 which contacts the emitter 19 through an opening 29 in the insulative layer 22. Similarly, a small, separate metalization region 30 provides electrical contact to the phototransistor base 17 through a like opening (not shown) in the layer 22.

In accordance with the present invention, the size of the opening 21 is controlled in response to the actual measured performance of the device 10. To this end, the opening 21 initially is made of quite small size. This is accomplished by initially covering the entire device 10 with a layer of metal such as aluminum deposited by vapor deposition, sputtering or other known technique. The metal of course fills the openings 26, 27, 29 that are formed in the oxide layer 22 prior to metal deposition.

Figures 5, 6:
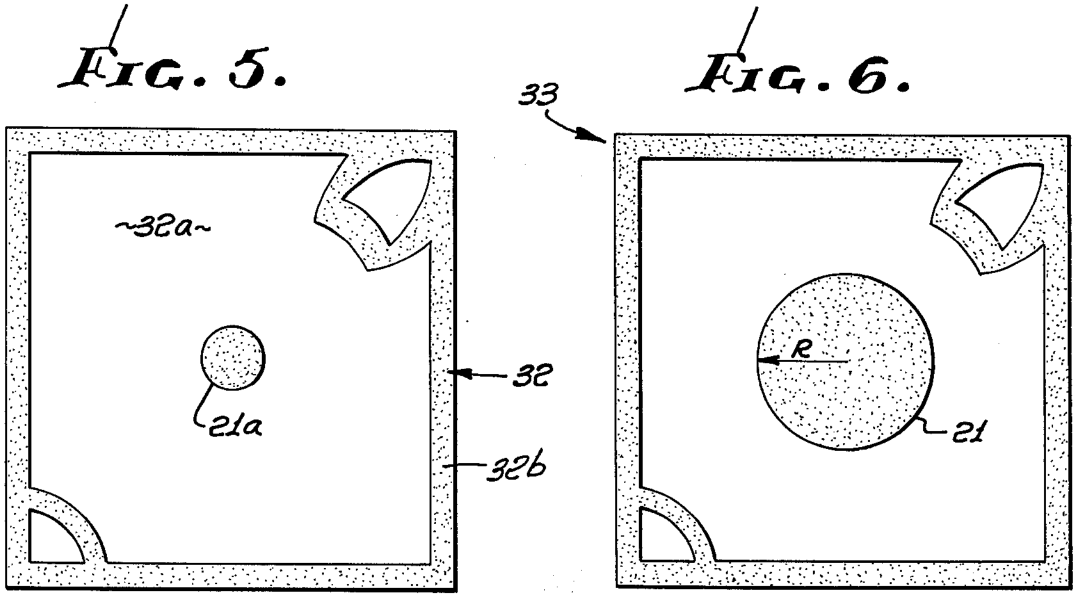
FIG. 5 shows the mask for initial metalization of the device of FIG. 1 with the smallest light-admitting opening.
FIG. 6 shows the mask used for subsequent enlargement of the light-admitting opening.

Next, a layer of photoresist is placed over the metal and exposed in a known manner to delineate the preferred metalization pattern 32 shown in FIG. 5. The unshaded areas 32*a* in FIG. 5 designate the regions in which photoresist remains on the metal. An etchant is used to remove the metal from the exposed (shaded) areas 32*b* that are not covered by the photoresist mask material. The photoresist then itself is removed, leaving in place the desired metalization pattern having a central opening 21*a* of minimum size. Next, the device 10 is sintered by exposure to a thermal environment of about 550°C. This causes an intermetallic reaction between the silicon and the aluminum, resulting in very efficient ohmic contacts with the various emitter and base regions. The sintering also provides a metalurgical bond between the metal and the oxide layer 22.

Each device 10 on the wafer 11 next is individually tested to determine its light response characteristics. The device is connected into an appropriate measurement circuit and illuminated through the small opening 21*a* with light of known intensity. The output current is measured, and in most cases will be less than the desired value. The opening 21 then is enlarged sufficiently to obtain the desired output current.

The extent to which the opening 21 must be enlarged may be determined empirically. Thus for a device 10 having certain base and emitter sizes and impurity concentrations, experience will show for example, that the output current will be directly proportional to the area of the opening 21, or if not directly related, will be nevertheless proportional to the opening area. In this manner, the size of the opening 21 necessary to achieve a certain current output can be ascertained. For example, if the output is directly proportional to the opening area, and the current measured with the smallest size opening 21 is half of the necessary value, then the opening must be doubled in area to obtain the requisite photodetector response.

A mask 33 like that of FIG. 6 is used to accomplish such enlargement of the opening 21. Again photoresist is placed over the entire surface of the device 10, and photo-optically exposed to form the mask 33. Note that the mask 33 has the identical shape of the earlier mask 32, except that the central opening 21 is larger. Again an etchant is used to remove the aluminum. Of course, the only place where aluminum will be removed in this step is in the opening 21 itself, which will be enlarged to the desired size. The radius R of the opening in the mask 33 will be selected as just described so that the resultant device output is at the desired level. When the opening enlargement has been accomplished, the mask 33 is removed and the device retested to confirm that the desired output level has been achieved.

For production purposes, a set of masks may be provided having opening diameters varying by a factor of two from each other. Conventional diffusion process control techniques generally permit fabrication of devices within an expected output current range of about four-to-one as a function of light intensity. Correction for this variation thus can be accomplished by using one of a set of four masks, differing from each other in area by a factor of two, to establish the necessary diameter of the opening 21.

Enlargement of the opening 21 may be accomplished incrementally. That is, the initial, smallest diameter opening 21*a* may be enlarged slightly, followed by measurement of the device output. If that output still is low, the opening is enlarged by another increment and the output measured again. The procedure is followed until the desired output is reached.

Figure 7:
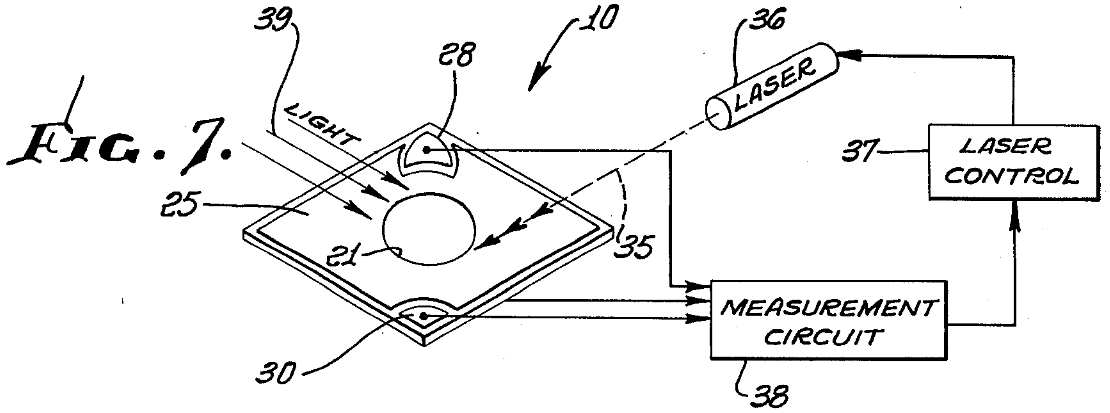
FIG. 7 diagrammatically illustrates the use of a laser beam to enlarge the light-admitting opening of a device in accordance with the present invention.

A particularly opportune method of carrying out such enlargement is illustrated in FIG. 7. Here, a beam 35 from a laser 36 is used to remove excess metal from the layer 25. The laser is positioned and turned on and off by a control unit 37 that operates in response to the output of a measurement circuit 38 which monitors the output current from the device 10. As the device 10 is illuminated by light of known intensity (indicated by the arrows 39) an output current is produced from the device 10. Initially, this output current will be below the desired value. As a result, the measurement circuit 38 and laser control unit 37 will energize the laser 36 so that beam 35 will evaporate some of the deposited metal, thereby enlarging the opening 21. The device 10 output current will increase. The process continues until the desired output current is achieved, at which time the measurement circuit 38 and laser control unit 37 will turn off the laser 36. In this implementation, the deposited metal preferably itself should be light absorbing or covered with a black, light absorbent material, so that the laser beam will not merely be reflected from the metal surface without causing evaporation of the metal.

As an alternative to the preceeding processes, the opening 21 initially may be made oversize, so that more than the requisite current output is produced by the device 10. Subsequently, additional metal is deposited into the opening 21 to reduce its size, until the desired current output is achieved.

The resultant photo-Darlington devices 10 all will have response characteristics within the desired narrow range, thereby significantly increasing the yields of batch fabrication, as compared to the prior art. Moreover, the geometry of the device affords certain benefits. The use of two emitters in the phototransistor, spaced on opposite sides of the light-admitting opening, results in improved conversion efficiency, and more consistent output even with non-uniform illumination. Moreover, the emitter-base junctions themselves are covered by the metalization layer 25, thereby reducing adverse effects such as "bucking".

Intending to claim all novel, useful and unobvious features shown or described, the applicant claims:

1. A process for fabricating a Darlington photodetector device having light response characteristics within a specified narrow range, comprising;

forming in a semiconductor substrate a relatively large base region for a phototransistor and a base region for a second transistor, and forming emitter regions in the respective base regions, producing an insulating layer over both said transistors, said layer having openings to both the emitter of said phototransistor and to the base of the second transistor, depositing an optically opaque metalization layer over a substantial portion of the base of said phototransistor and over the openings to said emitter and the second transistor base so as to electrically interconnect the same, providing an initial light-admitting opening of controlled area through said opaque metalization for passage of light to said phototransistor base region, the area of said initial opening being of such a size that the desired output current is not obtained, measuring the device output current while said device is illuminated with light of known level, and modifying the size of said opening to achieve an output current within the specified narrow range.

2. A process acccording to claim 1 wherein said providing step comprises, placing a first mask over said metalization layer, said first mask having an aperature of a first, too small size, and etching away said metal of said layer beneath the aperture of said mask to form an initial opening, and wherein said modifying step comprises, placing a second mask over said metalization layer, said second mask having an aperture of a second larger size situated concentrically with said initial opening, and etching away the metal of said layer to enlarge the size of said light-admitting opening.

3. a process according to claim 2 wherein the area ratio between said first and second size apertures is proportional to the ratio between the output current measured during said measuring step and the desired output current.

4. A process according to claim 1 wherein said initial opening is of too small size, and wherein said modifying comprises removing additional metal from said layer by laser to enlarge the size of said light-admitting opening.

5. A process according to claim 4 wherein said measuring and modifying steps are carried out concurrently, said laser being controlled automatically in response to said measuring.

6. A process according to claim 1 wherein said forming step includes forming a pair of spaced emitter regions in said phototransistor base region, said emitter regions being situated on opposite sides of said light-admitting opening to provide better efficiency and more consistent output even with non-uniform illumination of said phototransistor.

* * * * *